United States Patent [19]
Eckert

[11] 4,243,945
[45] Jan. 6, 1981

[54] DIFFERENTIAL AMPLIFIER
[75] Inventor: Kim Eckert, Austin, Tex.
[73] Assignee: Motorola, Inc., Schaumburg, Ill.
[21] Appl. No.: 35,039
[22] Filed: May 1, 1979
[51] Int. Cl.³ .............................................. H03F 3/45
[52] U.S. Cl. .................................. 330/253; 330/258; 330/310
[58] Field of Search ....................... 330/253, 258, 310
[56] References Cited

U.S. PATENT DOCUMENTS

| | | | |
|---|---|---|---|
| 3,401,351 | 9/1968 | Ellestad | 330/258 |
| 3,449,687 | 6/1969 | Knauber et al. | 330/253 |
| 4,004,245 | 1/1977 | Ochi et al. | 330/253 |
| 4,110,641 | 8/1978 | Payne | 330/253 |
| 4,185,211 | 1/1980 | Kucharewski | 330/253 |

*Primary Examiner*—Harold A. Dixon
*Attorney, Agent, or Firm*—Vincent B. Ingrassia

[57] ABSTRACT

A differential amplifier, preferably comprised of N-channel MOS devices and having a high ratio of differential gain to common mode gain, has an input stage which receives first and second potentials and amplifies the difference therebetween. Additional amplifying stages each include a depletion input load device having a gate which is coupled to the second potential for balancing the switching points of each additional stage over the common mode range.

12 Claims, 2 Drawing Figures

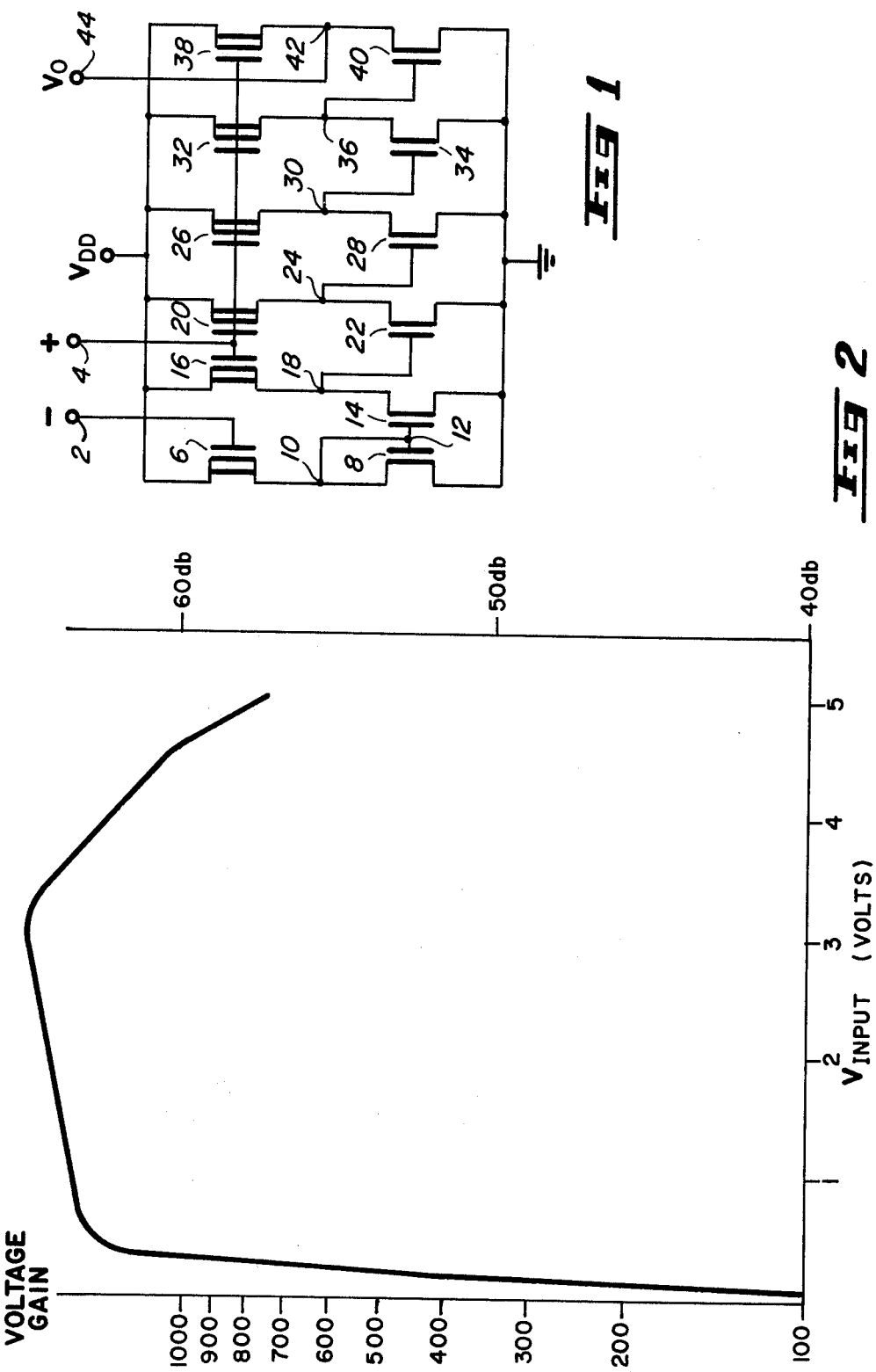

DIFFERENTIAL AMPLIFIER

BACKGROUND OF THE INVENTION

1. Field of the Invention

This invention relates generally to differential amplifiers, and more particularly to a metal-oxide-semiconductor (MOS) differential amplifier exhibiting high differential gain over a wide common mode range.

2. Description of the Prior Art

The advantages offered by NMOS technology are well known; e.g. higher density, greater yield, etc. Thus, smaller NMOS device geometries permit a greater number of devices to be produced per unit area or, stated another way, a single NMOS device will occupy less space. This characteristic is extremely important in the design and fabrication of complex digital integrated circuits; for example, single chip microprocessors.

Whereas digital circuitry is generally characterized by its "ON/OFF" or "ONE/ZERO" nature, most measurements in the real world are inherently analog; e.g., temperature, pressure, speed, voltage, etc. Therefore, it is necessary that microprocessors and other digital circuitry communicate or interface with analog circuitry such as amplifiers, buffers, comparators, etc., in order to permit digital processing of the analog signals. The required interfacing may be accomplished by providing analog components which are external to the microprocessor chip. However, such arrangements generally require more current, a larger power supply and commonly present more opportunities for design and manufacturing errors. To avoid these disadvantages, complex analog circuits such as differential amplifiers are being manufactured integrally with the digital circuitry; e.g., on the microprocessor chip itself, and due to the complex nature of microprocessors, the inclusion of analog devices on the same chip requires that the same manufacturing process be employed. Thus, a differential amplifier included on an NMOS microprocessor chip must be fabricated in accordance with NMOS processing techniques, and the design of the differential amplifier must be tailored to such processing techniques.

Previous MOS implementations of differential amplifiers have been very similar functionally to bipolar implementations. That is, both employ a current source, level shifters, integrator output buffers, etc. Furthermore, the prior art devices generally require an input stage having a high differential gain and a low common mode gain since each additional stage amplifies the common mode signal; i.e., errors produced in the first stage are further amplified in subsequent stages. Thus, the device is complex, requires a large number of components and is both costly and more difficult to fabricate. In addition, the use of enhancement devices at the inputs limits the maximum swing of the amplifier since these devices will turn off if the input becomes too low.

A detailed discussion of such prior art differential amplifiers can be found in the "IEEE Spectrum," February, 1979; pages 24-32 and in the "IEEE-Journal of Solid State Circuits"; December, 1978, pages 760-766.

SUMMARY OF THE INVENTION

It is an object of the present invention to provide a differential amplifier having large differential gain over a wide common mode range.

It is a further object of the invention to provide an MOS differential amplifier having a common mode gain which is not substantially increased by additional stages of amplification.

It is a still further object of the invention to provide a MOS differential amplifier having an improved input voltage swing.

These objects are achieved, in part, by using depletion devices as input loads and coupling the load gates to the amplifier input to balance their switching points over the common mode range.

According to a broad aspect of the invention there is provided a differential amplifier circuit for receiving first and second potentials and amplifying the difference therebetween, comprising: an input stage for receiving said first and second potentials; and at least one additional amplifying stage coupled to said input stage for amplifying said difference, said at least one additional amplifying stage having a first input coupled to one of said first and second potentials for reducing common mode gain.

According to a further object of the invention there is provided an NMOS differential amplifier for amplifying the difference between first and second input voltages, comprising: an input stage comprised of NMOS devices for receiving said first and second voltages and amplifying the difference therebetween; and at least one additional amplifying stage coupled to the output of said input stage, said additional amplifier stage including a depletion device having a gate coupled to one of said first and second input voltages.

The above and other objects, features and advantages of the invention will be better understood from the following detailed description taken in conjunction with the accompanying drawings, in which:

BRIEF DESCRIPTION OF THE DRAWINGS

FIG. 1 is a schematic diagram of the inventive differential amplifier circuit; and FIG. 2 illustrates in graphical form the differential gain of the inventive circuit as a function of the input voltage.

DESCRIPTION OF THE PREFERRED EMBODIMENT

FIG. 1 is a schematic diagram of the inventive differential amplifier circuit. While N-channel MOS devices are preferred, it should be clear that other processing techniques (E.G. P-channel, CMOS) could be used to implement the circuit.

Referring to FIG. 1, the amplifier is comprised of a first leg including depletion device 6 and enhancement device 8 and a second leg including depletion load device 16 and enhancement device 14. Each of these legs are coupled between a source of supply voltage $V_{DD}$ and ground as are the additional stages to be discussed hereinbelow. The gate of depletion device 6 is coupled to a negative input voltage terminal 2, and the gate of depletion device 16 is coupled to a positive input voltage terminal 4. The junction of the source of device 6 and the drain of device 8 (node 10) is coupled to the gates of enhancement devices 8 and 14 at node 12.

The circuit includes four additional stages each comprised of a depletion load device in series with an enhancement device coupled between $V_{DD}$ and ground. The gate of each depletion load device in each stage is coupled to the positive input voltage, and the gate of each enhancement device is coupled to the drain of the enhancement device of the previous stage. Thus, the first additional stage is comprised of depletion device 20 and enhancement device 22, the second additional stage is comprised of depletion device 26 and enhancement device 28, the third additional stage includes depletion device 32 and enhancement device 34 and the final or fifth stage comprises depletion device 38 and enhancement device 40. The gates of devices 20, 26, 32 and 38 are all coupled to the positive input voltage, and the gates of devices 22, 28, 34 and 40 are coupled to node 18, 24, 30 and 36 respectively. The output voltage Vo is available at node 42 and output terminal 44.

As in the case of prior art differential amplifiers it is desirable to increase the ratio of differential gain to common mode gain. This is accomplished with the instant inventive circuit because only the differential signal is amplified in subsequent stages while the common mode signal remains substantially constant. To illustrate this, assume that terminals 2 and 4 are coupled together rendering the gate potentials of devices 6 and 16 equal. The current through the first leg (devices 6 and 8) is dependent only on the voltage at terminal 2 and the voltage at node 10 is a function of that current. Since node 10 is coupled to the gates of devices 8 and 14 at node 12, and since the voltages at the gates of devices 6 and 16 are equal, the voltage at node 18 is substantially equal to the voltage at node 10 (approximately one enhancement threshold voltage above ground) if devices 6 and 16 are substantially identical and devices 8 and 14 are substantially identical. Thus, there is substantially no common-mode amplification. Referring now to the second stage, the same voltage is applied to the gate of device 20 as is applied to the gate of device 16, and the same voltage is applied to the gate of device 22 as is applied to the gate of device 14. Thus, the voltage at node 24 is substantially equal to the voltage at node 18. Using the same analysis, the voltages at nodes 30, 36 and 42 are equal to the voltage at nodes 20, 18 and 24 if devices 6, 16, 20, 26, 32 and 38 are identical and if devices 12, 14, 22, 28, 34 and 40 are identical. Thus, theoretically there is no amplification of the common mode signal in the additional stages.

Suitable results are obtained if the depletion devices used have a width of eight microns and a length of twenty microns, and the enhancement devices have a width of 130 microns and a length of eight microns. With these geometries, the output voltage was found to vary about 10 mv over the entire range of input voltages.

To illustrate the differential gain behavior of the circuit, assume that the voltage at terminal 4 remains constant and the voltage on terminal 2 approaches $V_{DD}$. This will cause the current through depletion device 6 to increase thus increasing the voltage at nodes 10 and 12, which voltage is applied to the gates of devices 8 and 14. The increased drive to device 14 causes it to conduct more current. Since the voltage at the gate of device 16 remains the same, the voltage at node 18 will decrease reducing the drive to device 22. Since, however, the drive to device 20 is unchanged, the voltage at node 24 increases. Using the same analysis, the voltage at node 30 decreases, the voltage at node 36 increases and the voltage at node 42 decreases. Since each stage of the amplifier imparts a differential gain of approximately five on the input signal with negligible common mode gain, the differential signal is substantially amplified at Vo.

FIG. 2 is a graphical representation of the voltage gain as a function of input voltage. It can be seen that over a common mode range of approximately 0.2 to 4.5 volts, a gain in excess of 60 db is achieved.

The foregoing description of the embodiment of the invention is by way of example only and is not intended to limit the scope of the appended claims. No attempt has been made to illustrate all possible embodiments of the invention but rather only to illustrate its principles in the best manner presently known to practice them. For example, the circuit may be implemented in NMOS, PMOS, CMOS, etc. The use of depletion type load devices serves to increase the overall input voltage swing. If this were not a critical requirement, enhancement devices could be employed. Further, the beneficial characteristics of the circuit will be achieved if the gates of the depletion devices in each additional stage are coupled to the positive or negative input. These and other modifications of the present invention as may occur to one skilled in the art are within the spirit and scope of the invention. It is therefore intended that this invention include all modifications and equivalents which fall within the scope of the appended claims. 9n

I claim:

1. A differential amplifier circuit for receiving first and second potentials and amplifying the difference therebetween, comprising:
    an input stage for receiving said first and second potentials; and
    a plurality of amplifying stages coupled in sequence for amplifying said difference each having a first input coupled to one of said first and second potentials for reducing common mode gain and a second input coupled to an output of a previous stage.

2. A differential amplifier circuit according to claim 1 wherein each of said amplifier stages comprises:
    first a second series connected MOS devices, said first device having a gate coupled to said first potential and said second device having a gate coupled to the output of a previous one of said stages.

3. An NMOS differential amplifier for amplifying the difference between first and second input voltages, comprising:
    an input stage comprised of NMOS devices for receiving said first and second voltages and amplifying the difference therebetween; and
    at least one additional amplifying stage coupled to the output of said input stage, said additional amplifier stage including a depletion device having a gate coupled to said first input voltage.

4. A differential amplifier circuit for receiving first and second potentials and amplifying the difference therebetween, comprising:
    an input stage for receiving said first and second potentials, said input stage including first and second pairs of series connected MOS devices, each pair coupled across a source of supply voltage and ground, said first potential coupled to one of said devices in said second pair and said second potential coupled to one of said devices in said first pair; and
    a plurality of amplifying stages coupled in sequence for amplifying said difference each of said amplifying stages including first and second series connected MOS devices, said first device having a gate coupled to one of said first and second potentials for reducing common mode gain and said second device having a gate coupled to the output of a previous one of said stages.

5. A differential amplifier circuit according to claim 4 wherein said first pair of devices comprises:
   a depletion device having a gate coupled to said second potential; and
   a first enhancement device whose drain is coupled to its gate.

6. A differential amplifier circuit according to claim 5 wherein said second pair of devices comprises:
   a depletion device having a gate coupled to said first potential; and
   an enhancement device having a gate coupled to the gate of said first enhancement device.

7. A differential amplifier circuit according to claim 6 wherein said first device in each of said plurality of amplifying stages is a depletion device and wherein said second device in each of said plurality of amplifying stages is an enhancement device.

8. A differential amplifier circuit according to claim 7 wherein the enhancement devices in each of said plurality of amplifying stages and in each of said first and second pairs are substantially identical and wherein the depletion devices in each of said plurality of amplifying stages and in said first and second pairs are substantially identical.

9. A differential amplifier circuit according to claim 8 wherein the resistance of the depletion devices is greater than that of the enhancement devices.

10. A differential amplifier circuit according to claim 9 wherein said MOS devices are N-channel MOS devices.

11. A differential amplifier circuit for amplifying the difference between first and second input voltages, comprising:
   an input stage coupled to said first and second voltages; and
   a plurality of amplifying stages coupled in sequence each including first and second MOS devices, said first device having a gate coupled to one of said first and second voltages and said second device having a gate coupled to the output of the previous stage.

12. A differential amplifier circuit for amplifying the difference between first and second input voltages, comprising:
   an input stage coupled to said first and second voltages; and
   a plurality of amplifying stages coupled in sequence each including first and second MOS devices, said first device having a gate coupled to one of said first and second voltages and said second device having a gate coupled to the output of the previous stage wherein said first device is a depletion device and said second device is an enhancement device.

* * * * *